US010756759B2

(12) United States Patent
Lahiri et al.

(10) Patent No.: US 10,756,759 B2
(45) Date of Patent: Aug. 25, 2020

(54) COLUMN DOMAIN DICTIONARY COMPRESSION

(75) Inventors: Tirthankar Lahiri, Palo Alto, CA (US); Chi-Kim Hoang, Palo Alto, CA (US); Dina Thomas, Palo Alto, CA (US); Kirk Meredith Edson, Fremont, CA (US); Subhradyuti Sarkar, Fremont, CA (US); Mark McAuliffe, Palo Alto, CA (US); Marie-Anne Neimat, Atherton, CA (US); Chih-Ping Wang, Palo Alto, CA (US)

(73) Assignee: Oracle International Corporation, Redwood Shores, CA (US)

(*) Notice: Subject to any disclaimer, the term of this patent is extended or adjusted under 35 U.S.C. 154(b) by 0 days.

(21) Appl. No.: 13/224,327

(22) Filed: Sep. 2, 2011

(65) Prior Publication Data

US 2013/0060780 A1 Mar. 7, 2013

(51) Int. Cl.
*H03M 7/42* (2006.01)
*H03M 7/30* (2006.01)
*G06F 16/22* (2019.01)

(52) U.S. Cl.
CPC .......... *H03M 7/42* (2013.01); *G06F 16/221* (2019.01); *H03M 7/3088* (2013.01)

(58) Field of Classification Search
CPC ........ G06F 13/28; G06F 3/0608; G06F 16/24; G06F 16/284; G06F 3/067; G06F 9/32; G06F 9/3557
USPC ........................................................ 707/741
See application file for complete search history.

(56) References Cited

U.S. PATENT DOCUMENTS

| 6,018,747 | A | 1/2000 | Burns et al. |
| 6,061,697 | A | 5/2000 | Nakao |
| 6,414,610 | B1 | 7/2002 | Smith |
| 6,598,055 | B1 | 7/2003 | Keesey et al. |
| 6,671,853 | B1 | 12/2003 | Burkett et al. |
| 6,879,986 | B1 * | 4/2005 | Fisher |
| 6,883,137 | B1 | 4/2005 | Girardot et al. |
| 6,941,510 | B1 | 9/2005 | Ozzie et al. |
| 6,964,015 | B2 | 11/2005 | Demopoulos et al. |
| 6,965,897 | B1 | 11/2005 | Chen |
| 6,996,571 | B2 | 2/2006 | McConnell |
| 7,013,425 | B2 | 3/2006 | Kataoka |

(Continued)

FOREIGN PATENT DOCUMENTS

WO    WO 03/107576    12/2003

OTHER PUBLICATIONS

Abadi et al., "Integrating Compression and Execution in Column-Oriented Database Systems", XP-002485264, SIGMOD, dated Jun. 27-29, 2006, 12 pages.

(Continued)

*Primary Examiner* — Boris Gorney
*Assistant Examiner* — Bao G Tran
(74) *Attorney, Agent, or Firm* — Marcel K. Bingham; Hickman Palermo Becker Bingham LLP (57) ABSTRACT

In column domain dictionary compression, column values in one or more columns are tokenized by a single dictionary. The domain of the dictionary is the entire set of columns. A dictionary may not only map a token to a tokenized value, but also to a count ("token count") of the number of occurrences of the token and corresponding tokenized value in the dictionary's domain. Such information may be used to compute queries on the base table.

16 Claims, 2 Drawing Sheets

| CUSTOMER(UNCOMPRESSED) | | | |
|---|---|---|---|
| CUSTID | NAME | STATE | ZIP |
| 1 | CHARLIE | CA | 94301 |
| 2 | BROWN | CA | 94301 |
| 3 | BROWN | NV | 89599 |
| 4 | CHARLIE | NV | 89599 |
| 5 | CHAPLIN | WA | 98101 |
| 6 | CHAPLIN | CA | 94301 |

| NAME DICTIONARY | | |
|---|---|---|
| NAME ID | NAME VALUE | TOKCNT |
| 0 | CHARLIE | 2 |
| 1 | BROWN | 2 |
| 2 | CHAPLIN | 2 |

| CUSTOMER(COMPRESSED) | | | |
|---|---|---|---|
| ID | NAME | STATE | ZIP |
| 1 | [0] | | [0] |
| 2 | [1] | | [0] |
| 3 | [1] | | [1] |
| 4 | [0] | | [1] |
| 5 | [2] | | [0] |
| 6 | [2] | | [2] |

| STATE-ZIP DICTIONARY | | | |
|---|---|---|---|
| STATE-ZIP ID | STATE VALUE | ZIP VALUE | TOKCNT |
| 0 | CA | 94301 | 3 |
| 1 | NV | 89599 | 2 |
| 2 | WA | 98101 | 1 |

(56) References Cited

U.S. PATENT DOCUMENTS

| | | | |
|---|---|---|---|
| 7,031,956 B1 | 4/2006 | Lee et al. | |
| 7,080,094 B2 | 7/2006 | Dapp et al. | |
| 7,090,318 B2 | 8/2006 | Brown | |
| 7,143,397 B2 | 11/2006 | Imaura | |
| 7,260,580 B2 | 8/2007 | Gauweiler | |
| 7,302,489 B2 | 11/2007 | Kraft | |
| 7,340,673 B2 | 3/2008 | Malone | |
| 7,464,082 B2 | 12/2008 | Weiss | |
| 7,484,171 B2 | 1/2009 | Jeon et al. | |
| 7,586,839 B2 | 9/2009 | Childress et al. | |
| 7,730,104 B2 | 6/2010 | Uchiyama et al. | |
| 7,774,321 B2 | 8/2010 | Tomic et al. | |
| 7,779,350 B2 | 8/2010 | Bender et al. | |
| 7,831,540 B2 | 11/2010 | Medi et al. | |
| 7,844,632 B2 | 11/2010 | Zhou et al. | |
| 7,877,356 B1 | 1/2011 | Guiheneuf et al. | |
| 8,046,699 B2 | 10/2011 | Mohan et al. | |
| 8,073,841 B2 | 12/2011 | Tarachandani et al. | |
| 8,150,818 B2 | 4/2012 | Van Der Linden et al. | |
| 2001/0037346 A1 | 11/2001 | Johnson | |
| 2002/0075514 A1 | 6/2002 | Wright et al. | |
| 2002/0111965 A1 | 8/2002 | Kutter | |
| 2002/0123993 A1 | 9/2002 | Chau et al. | |
| 2003/0046317 A1 | 3/2003 | Cseri | |
| 2003/0069881 A1 | 4/2003 | Huttunen | |
| 2003/0093626 A1 | 5/2003 | Fister | |
| 2003/0101235 A1 | 5/2003 | Zhang | |
| 2004/0060006 A1 | 3/2004 | Lindblad et al. | |
| 2004/0068509 A1 | 4/2004 | Garden et al. | |
| 2004/0068696 A1 | 4/2004 | Seyrat et al. | |
| 2004/0143791 A1 | 7/2004 | Ito et al. | |
| 2004/0148278 A1 | 7/2004 | Milo et al. | |
| 2004/0267760 A1 | 12/2004 | Brundage et al. | |
| 2004/0268244 A1 | 12/2004 | Levanoni et al. | |
| 2004/0268305 A1 | 12/2004 | Hogg et al. | |
| 2005/0033733 A1 | 2/2005 | Shadmon et al. | |
| 2005/0044113 A1 | 2/2005 | Manikutty et al. | |
| 2005/0050054 A1 | 3/2005 | Clark et al. | |
| 2005/0086608 A1 | 4/2005 | Roessler | |
| 2005/0091188 A1 | 4/2005 | Pal et al. | |
| 2005/0097084 A1 | 5/2005 | Balmin et al. | |
| 2005/0108209 A1 | 5/2005 | Beyer et al. | |
| 2005/0114316 A1 | 5/2005 | Fontoura et al. | |
| 2005/0187973 A1 | 8/2005 | Brychell et al. | |
| 2005/0192998 A1 | 9/2005 | Dittrich et al. | |
| 2005/0228786 A1 | 10/2005 | Murthy et al. | |
| 2005/0228791 A1 | 10/2005 | Thusoo et al. | |
| 2005/0228828 A1 | 10/2005 | Chandrasekar et al. | |
| 2005/0278289 A1 | 12/2005 | Gauweiler | |
| 2005/0278616 A1 | 12/2005 | Eller | |
| 2005/0289125 A1 | 12/2005 | Liu et al. | |
| 2006/0021246 A1 | 2/2006 | Schulze et al. | |
| 2006/0031757 A9 | 2/2006 | Vincent | |
| 2006/0036631 A1 | 2/2006 | Cheslow | |
| 2006/0059324 A1 | 3/2006 | Simske | |
| 2006/0136508 A1 | 6/2006 | Idicula et al. | |
| 2006/0143340 A1 | 6/2006 | Labar | |
| 2006/0167912 A1 | 7/2006 | Coulson et al. | |
| 2006/0168513 A1 | 7/2006 | Coulson et al. | |
| 2006/0195783 A1 | 8/2006 | Davis et al. | |
| 2006/0212467 A1 | 9/2006 | Murphy et al. | |
| 2006/0242559 A1 | 10/2006 | Krantz et al. | |
| 2006/0277179 A1 | 12/2006 | Bailey | |
| 2007/0044012 A1 | 2/2007 | Suver et al. | |
| 2007/0061544 A1 | 3/2007 | Uppala | |
| 2007/0067461 A1 | 3/2007 | Savchenko et al. | |
| 2007/0079234 A1 | 4/2007 | McCollum et al. | |
| 2007/0136346 A1 | 6/2007 | Morris et al. | |
| 2007/0256061 A1* | 11/2007 | Victorov | G06F 21/125 717/141 |
| 2007/0271305 A1 | 11/2007 | Chandrasekar et al. | |
| 2008/0077606 A1 | 3/2008 | Fang et al. | |
| 2008/0098001 A1 | 4/2008 | Gupta et al. | |
| 2008/0098019 A1 | 4/2008 | Sthanikam et al. | |
| 2008/0098020 A1 | 4/2008 | Gupta et al. | |
| 2008/0098186 A1 | 4/2008 | Zhou | |
| 2008/0104025 A1 | 5/2008 | Dharamashi et al. | |
| 2008/0195933 A1 | 8/2008 | McKellar et al. | |
| 2008/0294676 A1* | 11/2008 | Faerber et al. | 707/102 |
| 2009/0094236 A1 | 4/2009 | Renkes et al. | |
| 2009/0141629 A1* | 6/2009 | Gerosa et al. | 370/235 |
| 2009/0150412 A1 | 6/2009 | Idicula et al. | |
| 2009/0248648 A1 | 10/2009 | Johnson et al. | |
| 2010/0205198 A1* | 8/2010 | Mishne | G06F 17/30864 707/759 |
| 2012/0109910 A1* | 5/2012 | Netz et al. | 707/693 |
| 2013/0018853 A1* | 1/2013 | Jayaraman et al. | 707/692 |

OTHER PUBLICATIONS

Ozden, Mustafa, "A Binary Encoding for Efficient XML Processing", Dec. 17, 2002, pp. 81-102.

Ozden, Mustafa, "A Binary Encoding for Efficient XML Processing", Dec. 17, 2002, 114 pages.

"WD97: How Word for Windows Uses Temporary Files" dated Nov. 16, 2006, downloaded from the Internet on Jan. 28, 2011, <http://support.microsoft.com/kb/89247> 6 pages.

Balmin et al., "Incremental Validation of XML Documents", ACM Trans. Database System, Dec. 24, 2004, 42 pages.

Bayardo et al., "Optimizing encoding: An evaluation of binary XML encoding optimizations for fast stream based XML processing", May 2004, Proceedings of the 13$^{th}$ International Conference on World Wide Web WWW 04, Publisher ACM press, pp. 345-354.

Bouchou et al., "Updates and Incremental Validation of XML Documents", LNCS 2921, 2004, pp. 216-232.

Catania et al., Lazy XML Updates: Laziness as a Virtue of Update and Structural Join Efficiency, SIGMOD Jun. 14-16, 2005, 2005, pp. 515-526.

Kanne et al., "Efficient Storage of XML data", Dec. 13, 1999, pp. 1-22.

Kim et al., "An Efficient XML Index Technique with Relative Position Coordinates", Dept. of Computer Science, Seoul, South Korea, WSEAS Transaction on Information Science and Applicaltions, vol. 2, No. 4, Apr. 2005, pp. 373-379.

La Fontaine et al., "A delta Format for XML: Identifying Changes in XML Files and Representing the Changes in XML", 2001, 26 pages.

Liefke et al., "Xmill: An efficient compressor for XML data", May 2000, ACM SIGMOD Record, Proceedings of the 2000 ACM SIGMOD international conference on Management of data SIGMOD 00', vol. 29, Issue 2, Publisher: ACM Press, pp. 153-164.

Liu et al., "Configurable indexing and ranking for XML information retrieval", Jul. 2004, Proceedings of the 27$^{th}$ annual international ACM SIGIR conference on Research and Development in information retrieval SIGIR 04, Published by ACM Press. pp. 88-95.

Min et al., "XML Indexing and compression: XPRESS: a queriable compression for XML data", Jun. 2003, Proceedings of the 2003 ACM SIGMOD international conference on Management of data SIGMOD 03, Published by ACM Press, pp. 122-133.

PCT/US2007/010163, Notification of Transmittal of the International Search Report and Written Opinion of the International Searching Authority, dated Oct. 12, 2007, 12 pages.

"WAP Binary XML Content Format" downloaded from the Internet Nov. 9, 2007 <http ://www.w3.org/TR/wbxm/> 15 pages.

"What's New in the XDK?" downloaded from the Internet Nov. 9, 2007 <http://download.oracle.com/docs/cd/B28359_01/appdev.111/b28394/whatsnew.htm > 3 pages.

Wong, "The Extended XQL for Querying and Updating Large XML Databases", DocEng '07, Nov. 9-10, 2001, pp. 95-104.

Yu et al., "Dynamically updating XML Data: Numbering Scheme Revisited", Internet and Web Information Systems, 8, 2005, pp. 5-26.

Zou et al., "XML Processing: Ctree:a compact tree for indexing XML data", Nov. 2004, Proceedings of the 6$^{th}$ annual international workshop on Web information and data management WIDM '04, Published by ACM Press, pp. 39-46.

(56) References Cited

OTHER PUBLICATIONS

"3 Using Oracle XML DB" downloaded from the Internet Nov. 9, 2007 <http://download.oracle.com/docs/cd/B28359_01/appdev.111/b28369/xdb03usg.htm> 63 pages.

"4 XML Parsing for Java" downloaded from the Internet Nov. 9, 2007 <http://download.oracle.com/docs/cd/B28359_01/appdev.111/b28394/adx_j_parser.htm> 42 pages.

"4 XMLType Operations" downloaded from the Internet Nov. 9, 2007 <http://download.oracle.com/docs/cd/B28359_01/appdev.111/b28369/xdb04cre.htm> 29 pages.

"20 Using the XML Schema Processor for C" downloaded from the Internet Nov. 9, 2007 <http://download.oracle.com/docs/cd/B28359_01/appdev.111/b28394/adx_c_sproc.htm> 10 pages.

Zhang et al., "TDX: A High Perfomrance Table-driven XML Parser", In proceedings of the 44th annual (ACM) Southeast Regional Conference, Mar. 2006, ACM, pp. 726-731.

Myer, "A Really, Really Good Introduciton to XML", Sitepoint, dated Aug. 24, 2005, 107 pages.

Kangasharju et al., "Xebu: A Binary Format with Schema-Based Optimzations for XML Data", dated Nov. 20-22, dated 2005, pp. 528-535.

Ewald, Arnold, "1.9. Using the WAP Binary XML Parser", dated Dec. 27, 2005, The Ulxmlrpcpp Handbook, p. 1 through table of content, 3 pages.

Kanne et al., "Efficient Storage of XML Data", dated Jun. 16, 1999, 20 pages.

U.S. Appl. No. 13/533,722, filed Jun. 26, 2012, Advisory Action, dated Jun. 6, 2014.

U.S. Appl. No. 11/437,512, filed May 18, 2006, Office Action, dated May 22, 2014.

U.S. Appl. No. 11/437,512, filed May 18, 2006, Interview Summary, dated Feb. 25, 2016.

U.S. Appl. No. 11/437,512, filed May 18, 2006, Final Office Action, dated Oct. 3, 2014.

U.S. Appl. No. 11/437,512, filed May 18, 2006, Office Action, dated Oct. 14, 2015.

U.S. Appl. No. 13/533,722, filed Jun. 26, 2012, Office Action, dated Aug. 27, 2013.

U.S. Appl. No. 11/437,512, filed May 18, 2006, Notice of Allowance, dated May 17, 2016.

U.S. Appl. No. 13/631,434, filed Sep. 28, 2012, Notice of Allowance, dated Mar. 20, 2014.

U.S. Appl. No. 13/533,722, filed Jun. 26, 2012, Final Office Action, dated Apr. 2, 2014.

Medi, U.S. Appl. No. 13/533,722, filed Jun. 26, 2012, Notice of Allowance, dated Feb. 2, 2017.

\* cited by examiner

NAME DICTIONARY

| NAME ID | NAME VALUE | TOKCNT |
|---|---|---|
| 0 | CHARLIE | 2 |
| 1 | BROWN | 2 |
| 2 | CHAPLIN | 2 |

STATE-ZIP DICTIONARY

| STATE-ZIP ID | STATE VALUE | ZIP VALUE | TOKCNT |
|---|---|---|---|
| 0 | CA | 94301 | 3 |
| 1 | NV | 89599 | 2 |
| 2 | WA | 98101 | 1 |

CUSTOMER(UNCOMPRESSED)

| CUSTID | NAME | STATE | ZIP |
|---|---|---|---|
| 1 | CHARLIE | CA | 94301 |
| 2 | BROWN | CA | 94301 |
| 3 | BROWN | NV | 89599 |
| 4 | CHARLIE | NV | 89599 |
| 5 | CHAPLIN | WA | 98101 |
| 6 | CHAPLIN | CA | 94301 |

CUSTOMER(COMPRESSED)

| ID | NAME | STATE | ZIP |
|---|---|---|---|
| 1 | [0] | [0] | |
| 2 | [1] | [0] | |
| 3 | [1] | [1] | |
| 4 | [0] | [1] | |
| 5 | [2] | [0] | |
| 6 | [2] | [2] | |

COLUMN DOMAIN DICTIONARY COMPRESSION

FIELD OF THE INVENTION

The present application is related to database systems, and in particular, storing database data for efficient access.

BACKGROUND

Data in a relational or object-relational database is stored as relations comprising rows or tuples that share the same columns. There are several formats of storing rows, which are row-major and column-major. In row-major format, column values of a single row are stored contiguously within a unit of persistent storage, such as a data block. In column-major format, values of a column of multiple rows are stored contiguously. Row-major format or column-major format are collectively referred to herein as major formats.

Each major format has its advantageous. For example, column-major format is advantageous for queries that require scanning a single column to generate aggregate values for those columns. Such queries occur often in the context of data warehousing and decision support systems. On the other hand, row-major format is advantageous for queries that return rows with multiple columns or for modifications to a few number of rows. The major format of a column and the compression technique used, if any, is referred to herein as a storage format.

Described herein are techniques that provide advantages of both row-major and column-major format.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Described herein are dictionary based compression techniques referred to herein as column domain dictionary compression. In dictionary based compression of a column, a value is represented by a token, which is typically much smaller than the value the token represents. A dictionary maps tokens to values. Occurrences of a value in a column are replaced with the token mapped by the dictionary to the value.

A value that is mapped to a token by a dictionary is referred to herein as the actual value. With respect to a dictionary, the set of actual values that are to be encoded according to the dictionary is referred to herein as the domain of the dictionary.

In column domain dictionary compression, column values in a set of one or more columns are the domain of a single dictionary. Each column in the set is referred to as a base column with respect to the dictionary and the set is referred to as a column group. Similarly, a table that contains a base column for a dictionary is referred to herein as a base table with respect to the dictionary and the column group.

A dictionary may not only map a token to an actual value, but also to a count ("token count") of the number of occurrences of the token in the column group. The token count also represents the number of occurrences that actual value mapped to the token occurs in the column group. Such information may be used to compute queries on the base table. According to an embodiment of the present invention, queries on a base table may be rewritten to instead reference a dictionary. The query may be computed much more efficiently without have to access the base table.

Importantly, column domain dictionary compression provides advantages of both row-major format and column-major formant, as shall be explained later in greater detail.

Examplary Database System

An embodiment of the present invention may be implemented in a database system. A database system includes at least one database server that manages a database. Generally, a server, such as a database server, is a combination of integrated software components and an allocation of computational resources, such as memory, a node, and processes on the node for executing the integrated software components, where the combination of the software and computational resources are dedicated to providing a particular type of function on behalf of clients of the server. A database server governs and facilitates access to a particular database, processing requests by clients to access the database.

A database comprises data and metadata that is stored on a persistent or volatile memory mechanism, such as a set of hard disks. Database metadata defines database objects, such as tables and columns therein, object tables, views, or complex types, such as object types, and functions.

Application clients interact with a database server to access data in the database managed by the database server. Clients access the database data by submitting to the database server commands that cause the database server to perform operations on data stored in a database. A database command may be in the form of a database statement that conforms to a database language, such as the Structured Query Language (SQL). There are many different versions of SQL, some versions are standard and some proprietary, and there are a variety of extensions. Data manipulation language ("DML") statements are issued to a database server to query or request changes to a database. Data definition language ("DDL") instructions are issued to a database server to create or configure database objects, such as tables, views, or complex data types, or to control how DML statements are to be processed.

According to an embodiment, an application client issues database server commands via a database session. A session, such as a database session, is a particular connection established for a client to a server, such as a database instance, through which the client issues a series of requests (e.g., requests for execution of database statements).

For each database session established on a database instance, session state is maintained for the session. Session state includes the data stored for a database session for the duration of the database session. Such data includes, for example, the identity of the client for which the session is established, and temporary variable values generated by processes and database components executing software within the database session.

In an embodiment, a database server is an in-memory database server. In-memory database servers are described in related patent applications Automated Integrated High Availability Of The In-Memory and Database Cache and the Backend Enterprise Database.

Example Compressed Table and Dictionaries

Figure 1:
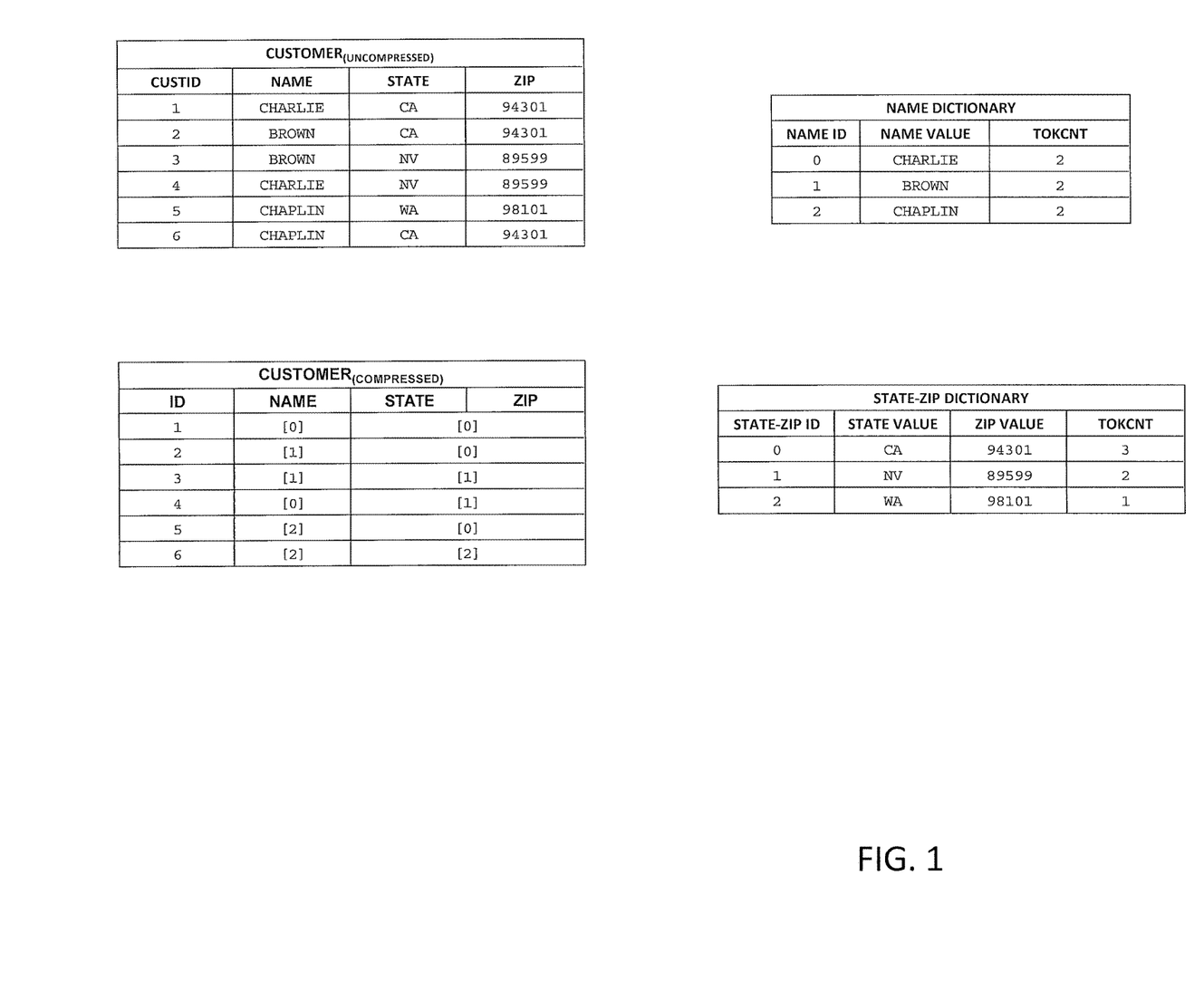
FIG. 1 is diagram depicting a table and dictionaries arranged according to column domain compression, according to an embodiment of the present invention.

FIG. 1 depicts an example table and dictionaries used to illustrate column domain dictionary compression according to an embodiment. Referring to FIG. 1, it depicts two versions of a database table CUSTOMER, which is compressed according columnar domain dictionary compression. The two versions depicted are an uncompressed and a compressed version.

CUSTOMER includes four columns, which are CUSTID, NAME, STATE and ZIP. In the uncompressed version, NAME, STATE, and ZIP store strings. CUSTID is an id column, such as a primary key. An id value ("id") in an id column is used herein to refer to the row that contains the id. For example, row 1 in uncompressed CUSTOMER is referring to the row with CUSTID value 1, which also contains the strings CHARLIE, CA, and 94301 in columns NAME, STATE, and ZIP, respectively.

In compressed CUSTOMER, column NAME is compressed using DICTIONARY NAME and columns STATE and ZIP are compressed using DICTIONARY STATE-ZIP. DICTIONARY NAME is a relational table containing columns NAME ID, NAME VALUE, and TOKCNT. NAME ID is an id column, and NAME VALUE is a column containing distinct values from NAME in CUSTOMER. Values in NAME ID also serve as a token for an actual value stored in NAME VALUE. An id used as a token to encode an actual value may also be referred to herein as a token id.

Each row in DICTIONARY NAME maps a token id in NAME ID to the actual value in column NAME VALUE. In compressed CUSTOMER, a token id in NAME ID is stored in lieu of the corresponding actual value to which the NAME ID value is mapped. For example, in DICTIONARY NAME, the string value CHARLIE is mapped to token id 0. In uncompressed CUSTOMER, rows 1 and 4 contain the actual column value CHARLIE in column NAME, while in compressed CUSTOMER, rows 1 and 4 contain the token id 0 in lieu of CHARLIE.

Each row in a dictionary table holds a token count that is stored in column TOKCNT. For example, row 0 of NAME DICTIONARY contains the value 2 in TOKCNT, specifying the two rows in the base table CUSTOMER store the token id 0 in column NAME and representing that the column contains two occurrences the actual value CHARLIE.

Columns STATE and ZIP represent a compression group of two columns that are together encoded by STATE-ZIP DICTIONARY table. STATE-ZIP DICTIONARY includes columns STATE-ZIP ID, STATE VALUE, ZIP VALUE, and TOKCNT. STATE-ZIP ID holds token ids. Each row in STATE-ZIP DICTIONARY maps a token id to a concatenation of the pair of column values in columns STATE VALUE and ZIP VALUE. For example, row 0 maps STATE-ZIP ID 0 to a concatenation of CA and 94301. In compressed CUSTOMER, row 1 contains token id 0 to represent the combination of column values CA and 94301 in columns STATE and ZIP.

In an embodiment, the token ids of a dictionary table are storage location identifiers that identify a storage location of a row within storage structures that store a dictionary table. For example, a row-id of a row identifies a data block storing the row and a storage location within the data block of where the row is stored. Using the row-id as token, a dictionary table row maps its row-id to an actual value. Given a row-id, the row may be accessed very quickly to access the mapped actual value.

In an embodiment, CUSTOMER and NAME DICTIONARY and STATE-ZIP DICTIONARY are in-memory tables in an in-memory database server. A row-id is an offset from a base memory address of the in-memory database.

Setting Up and Maintaining Compression Groups

According to an embodiment, column groups may be declaratively set up in a database by submitting DDL commands to a database server. For example, a COMPRESS clause in CREATE TABLE DDL statement or ALTER TABLE ADD statement can specify the one or more columns of the compression group and one or more parameters for compression.

Among the one or more parameters is a maximum number of distinct values to tokenize. This number dictates the needed number of entries in a dictionary and the size (e.g byte size) of the token id. According to an embodiment, the parameter may specify one of three threshold numbers: 256, 64k, and 4G, which correspond to that number of entries. The size of the id used for each number is respectively 8 bits, 16 bits and 32 bits.

According to an embodiment, when a database server receives and/or processes the DDL statement, the database server configures itself for column domain compression according to the DDL statement. Such configuration entails creating a dictionary for the specified column group in the statement. The configuration also includes modifying database metadata to define the dictionary, to define the column group on the base table, and to associate the dictionary with the column group. When a database server computes queries referencing and/or requiring access to a column group, the database server consults the dictionary to decode the tokens in the column group.

Preferably the dictionary is a dictionary table that may be accessed via queries in the way other database tables are accessed. All actual values contained in the column group are mapped to tokens according to the dictionary.

A base table with a compression group may be modified by delete, insert, and update operations, in response to, for example, database commands received by a database server. Such operations may entail encoding a column value for the compression group according to a dictionary and storing the resultant token in the compression group, and modifying the dictionary to increment or decrement a token count or to insert a new entry for a new token for a new column value.

For example, a row is inserted into CUSTOMER with values CUSTID=7, NAME=CHAPLIN, and STATE=CA and ZIP=94301. In NAME DICTIONARY in row 2, this operation causes the token count in TOKCNT to be incremented to 3 to reflect that the number of rows in CUSTOMER that hold token id 0 in NAME in lieu of the actual value CHAPLIN is three.

As another example, an update is performed on row 6 to change NAME to DOE. In NAME DICTIONARY in row 2, this operation causes TOKCNT to be decremented to 1. In addition, a new row is inserted in NAME DICTIONARY with the values 3, DOE, and 1 in columns NAME ID, NAME VALUE, and TOKCNT, respectively.

Column-Major Format Like Representation

As mentioned before, an advantage of column-major format is that many values of columns can be efficiently scanned to perform operations such as aggregations. A reason for this efficiency is that sets of column values are stored contiguously in blocks of persistent storage, while in row-major format the column values are not stored contiguously but are instead interleaved with the values of other columns of the table. In effect, in column-major format, the column values of a column are stored more densely while in row-major the column values of a column are stored more sparsely.

Further, in column-major format, values that are stored contiguously are of the same data type. Being the same data type may mean that contiguously stored values may share common properties that can be exploited to enhance compressibility for certain compression techniques.

Thus, under column-major format for a column, the data density and compressibility of data can be enhanced. As a result, to read a given set of columns values less data is required to be read from storage.

A dictionary provides a form of storage that is akin to column-major format, and for a given compression group, provides advantages of data density and compressibility. These advantages are achieved even though the dictionary itself may be stored in row-major format. Assuming the dictionary has a significantly smaller number of columns than that of the base table, the density of rows is greater for the dictionary than for the base table, and, inherently, so is the density of column values. Second, the mapping of the column values to token counts is, in effect, a compressed representation that may usable for certain types of computations. In fact, as described further below, the compression representation is exploited to perform certain types of queries more efficiently.

Finally, while a dictionary is akin to column-major format in many respects, the advantages of row-major format are preserved because the base table is stored in row-major format. For example, entire rows may be retrieved from the base table without having to stitch column values read from many data blocks in storage.

Query Rewriting

Certain types of queries that require access to a base table can be rewritten to instead access a dictionary table. Queries rewritten in this may be executed more efficiently to provide the same result.

According to an embodiment, the rewrites are performed by a query optimizer of a database server. A query optimizer evaluates a query to optimize execution of a query by rewriting the query and/or generating and selecting an execution plan for executing the query or a rewritten version thereof. The query may be rewritten before generating an execution plan.

More than one kind of rewrite may be performed. Generally, the rewritten query is semantically equivalent to the version of the query before rewrite. A query is semantically equivalent to another when the queries request (or declare) the same results; computation of either should return the same result. The fact that the dictionary table is a relational table facilitates query rewrites to access the dictionary table.

The following are examples of queries issued against table CUSTOMER that may be rewritten to access a dictionary table.

1. Distinct Operation
SELECT DISTINCT ZIP, STATE FROM CUSTOMER IS REWRITTEN TO: SELECT "ZIP VALUE", "STATE VALUE" FROM "STATE-ZIP DICTIONARY". Note that if state-zip dictionary included another column in the compression group for state-zip dictionary, the query can be rewritten to:
SELECT DISTINCT "NAME VALUE", "STATE VALUE" FROM "STATE-ZIP DICTIONARY".

2. Aggregate Distinct
SELECT COUNT (DISTINCT NAME) FROM CUSTOMER is rewritten to:
SELECT COUNT ("NAME VALUE") FROM "NAME DICTIONARY".

3. Complex Expression Evaluator
SELECT * FROM CUSTOMER WHERE NAME LIKE '% ABC %' is rewritten to:
SELECT * FROM CUSTOMER WHERE TOKEN ID (NAME) IN (SELECT ID FROM "NAME DICTIONARY" WHERE "NAME VALUE" LIKE '% ABC %').

Note the expression token_id(name) returns the token id contained in NAME. There are other types of query rewrites that may be performed. Those are illustrated using different tables than those illustrated in FIG. 1 as described below.

4. Aggregation Query without Groupby:
Compression group x1 and y1 are defined for a table t1. Table t1_compr is the dictionary table with columns x1 value and y1 value holding the actual values of x1 and y1, respectively, and column tokcnt storing the token counts.
SELECT SUM (X1) FROM T1 is rewritten to:
SELECT SUM ("X1 VALUE"* TOKCNT) FROM T1_COMPR.

5. Aggregation with Groupby:
Using the current example for table T1.
SELECT SUM (X1) FROM T1 GROUP BY Y1 is rewritten to:
SELECT SUM ("X1 VALUE"* TOKCNT) FROM T1_COMPRESS GROUP BY Y1;

6. Semi-Join
Compression group x2 is defined for a table t2. t2_compr is a dictionary table with column x2 value holding the actual values for x2, and column tokcnt storing the token counts.
SELECT * FROM T1 WHERE X1 IN (SELECT X2 FROM T2) is rewritten to:
SELECT * FROM T1, T2_COMPR WHERE X1="X2 VALUE";

Column Domain Compression Versus Other Dictionary Compression

For purposes of disambiguating column domain dictionary compression from other possible forms of dictionary compression in database systems, a comparison is useful. One such other form is data block domain dictionary compression.

A data block is a unit of persistent storage used by a database server to store database records (e.g. to store rows of a table, to store column values of a column). When records are read from persistent storage, a data block containing the record is copied into a data block buffer in volatile memory of a database server. A data block usually contains multiple rows, and control and formatting information, (e.g. offsets to sequences of bytes representing rows or other data structures, list of transactions affecting a row).

A data block is referred to as being atomic because, at least in part, a data block is the smallest unit of database data a database server may request from a persistent storage device. For example, when a database server seeks a row that is stored in a data block, the data block may only read the row from persistent storage by reading in the entire data block.

In data block domain dictionary compression, a dictionary is stored in the data block. The domain of the dictionary is the data block and it may be used to tokenize column values of columns of rows in the data block. In other words, the domain of the dictionary in a data block is the data block; the dictionary does not pertain to other data blocks.

In column domain dictionary compression, the domain of a dictionary is the entire column. In database systems where database data is stored in data blocks, the dictionary maps column values of a column (compression group) that are stored in multiple data blocks. Further, the dictionary is stored in a separate data structure (e.g. a database object, e.g. dictionary table), while in data block domain dictionary compression the dictionaries are not stored separately but in the same data structure at several levels, i.e. in the same table and even in the same atomic level of storage, the data block.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 2:
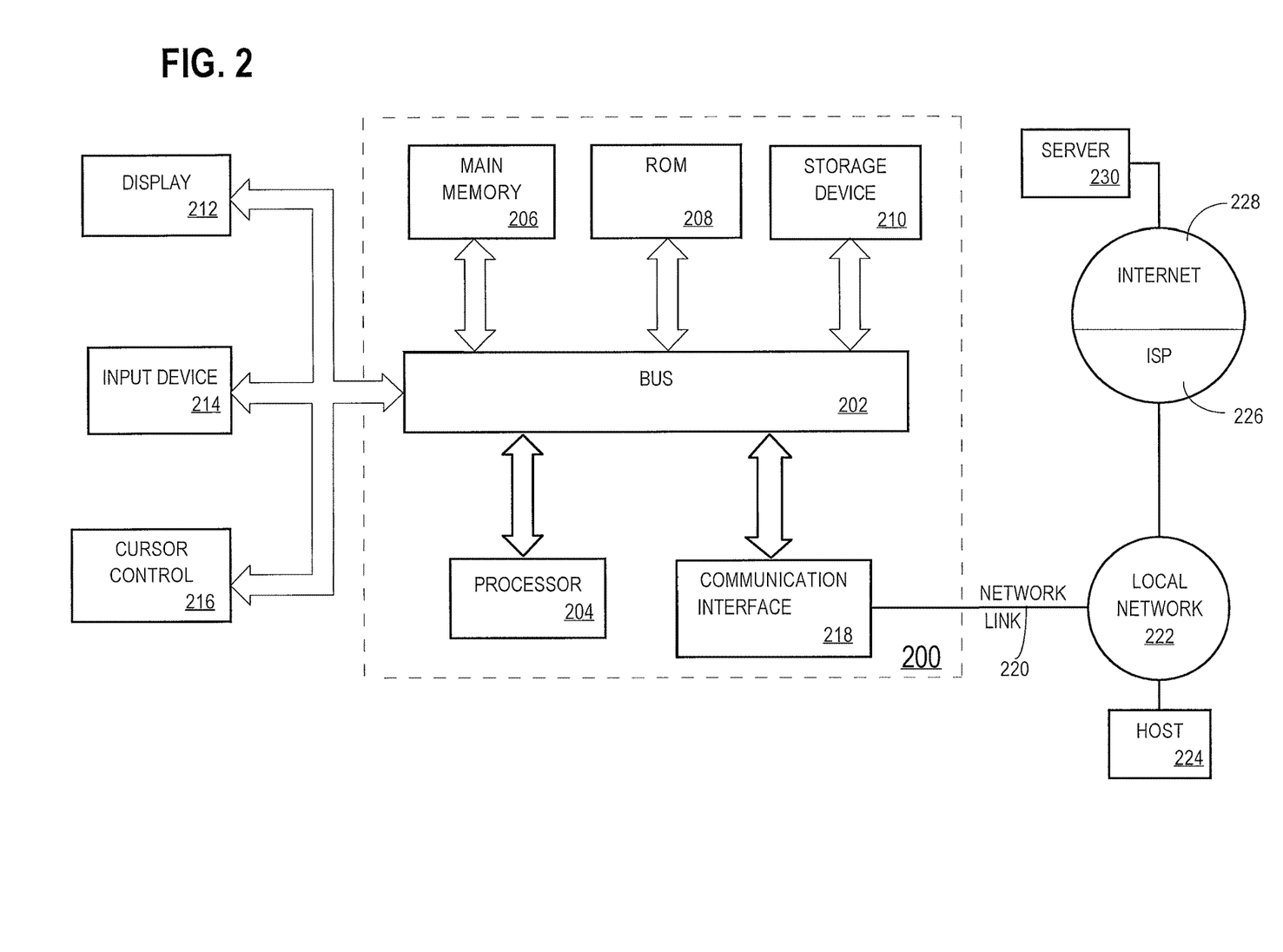
FIG. 2 is diagram depicting a computer system that may be used in an embodiment.

For example, FIG. 2 is a block diagram that illustrates a computer system 200 upon which an embodiment of the invention may be implemented. Computer system 200 includes a bus 202 or other communication mechanism for communicating information, and a hardware processor 204 coupled with bus 202 for processing information. Hardware processor 204 may be, for example, a general purpose microprocessor.

Computer system 200 also includes a main memory 206, such as a random access memory (RAM) or other dynamic storage device, coupled to bus 202 for storing information and instructions to be executed by processor 204. Main memory 206 also may be used for storing temporary variables or other intermediate information during execution of instructions to be executed by processor 204. Such instructions, when stored in non-transitory storage media accessible to processor 204, render computer system 200 into a special-purpose machine that is customized to perform the operations specified in the instructions.

Computer system 200 further includes a read only memory (ROM) 208 or other static storage device coupled to bus 202 for storing static information and instructions for processor 204. A storage device 210, such as a magnetic disk or optical disk, is provided and coupled to bus 202 for storing information and instructions.

Computer system 200 may be coupled via bus 202 to a display 212, such as a cathode ray tube (CRT), for displaying information to a computer user. An input device 214, including alphanumeric and other keys, is coupled to bus 202 for communicating information and command selections to processor 204. Another type of user input device is cursor control 216, such as a mouse, a trackball, or cursor direction keys for communicating direction information and command selections to processor 204 and for controlling cursor movement on display 212. This input device typically has two degrees of freedom in two axes, a first axis (e.g., x) and a second axis (e.g., y), that allows the device to specify positions in a plane.

Computer system 200 may implement the techniques described herein using customized hard-wired logic, one or more ASICs or FPGAs, firmware and/or program logic which in combination with the computer system causes or programs computer system 200 to be a special-purpose machine. According to one embodiment, the techniques herein are performed by computer system 200 in response to processor 204 executing one or more sequences of one or more instructions contained in main memory 206. Such instructions may be read into main memory 206 from another storage medium, such as storage device 210. Execution of the sequences of instructions contained in main memory 206 causes processor 204 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 210. Volatile media includes dynamic memory, such as main memory 206. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 202. Transmission media can also take the form of acoustic or light waves, such as those generated during radio-wave and infra-red data communications.

Various forms of media may be involved in carrying one or more sequences of one or more instructions to processor 204 for execution. For example, the instructions may initially be carried on a magnetic disk or solid state drive of a remote computer. The remote computer can load the instructions into its dynamic memory and send the instructions over a telephone line using a modem. A modem local to computer system 200 can receive the data on the telephone line and use an infra-red transmitter to convert the data to an infra-red signal. An infra-red detector can receive the data carried in the infra-red signal and appropriate circuitry can place the data on bus 202. Bus 202 carries the data to main memory 206, from which processor 204 retrieves and executes the instructions. The instructions received by main memory 206 may optionally be stored on storage device 210 either before or after execution by processor 204.

Computer system 200 also includes a communication interface 218 coupled to bus 202. Communication interface 218 provides a two-way data communication coupling to a network link 220 that is connected to a local network 222. For example, communication interface 218 may be an integrated services digital network (ISDN) card, cable modem, satellite modem, or a modem to provide a data communication connection to a corresponding type of telephone line. As another example, communication interface 218 may be a local area network (LAN) card to provide a data communication connection to a compatible LAN. Wireless links may also be implemented. In any such implementation, communication interface 218 sends and receives electrical, electromagnetic or optical signals that carry digital data streams representing various types of information.

Network link 220 typically provides data communication through one or more networks to other data devices. For example, network link 220 may provide a connection through local network 222 to a host computer 224 or to data equipment operated by an Internet Service Provider (ISP) 226. ISP 226 in turn provides data communication services through the world wide packet data communication network now commonly referred to as the "Internet" 228. Local network 222 and Internet 228 both use electrical, electromagnetic or optical signals that carry digital data streams. The signals through the various networks and the signals on network link 220 and through communication interface 218, which carry the digital data to and from computer system 200, are example forms of transmission media.

Computer system 200 can send messages and receive data, including program code, through the network(s), network link 220 and communication interface 218. In the Internet example, a server 230 might transmit a requested code for an application program through Internet 228, ISP 226, local network 222 and communication interface 218.

The received code may be executed by processor 204 as it is received, and/or stored in storage device 210, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method, the method comprising steps of:
   storing in an in-memory database a dictionary table that has one or more entries, wherein each entry of said one or more entries maps a single token to an actual column value contained in a corresponding column of a base table that is stored in said in-memory database, said dictionary table being stored and maintained as a data structure separate from said base table, said single token comprising an offset to a memory address to indicate a storage location of a row containing said entry mapping said single token to said actual column value;
   storing in said corresponding column of said base table a particular single token in lieu of a particular actual column value mapped by a particular entry of said one or more entries to said particular single token; and
   computing a query that conforms to a database language, wherein computing a query includes decoding the particular single token to generate the particular actual column value mapped by said particular entry to said respective single token.

2. The method of claim 1, the steps further including rewriting another query that references said base table but not said dictionary table to create a transformed query that references said dictionary table.

3. The method of claim 1, the steps further including receiving a DDL statement that defines a compression group on said base table.

4. A method, the method comprising steps of:
   storing a dictionary having one or more entries, wherein each entry of said one or more entries maps a single token to a combination of actual column values contained in at least two corresponding columns of a base table, said at least two corresponding columns comprising a compression group on said base table, said dictionary being stored and maintained as a data structure separate from said base table;
   for a particular entry of said dictionary table, storing in said compression group of said base table the respective single token of said particular entry in lieu of the respective combination of actual column values that is mapped by said particular entry to said respective single token; and
   computing a query that conforms to a database language, wherein computing a query includes decoding the respective single token of said particular entry to generate the respective combination of actual column values that is mapped by said particular entry to said respective single token.

5. The method of claim 4,
   wherein said dictionary is a dictionary table; and
   the steps further including rewriting another query, that references said base table but not said dictionary table, into a transformed query that references the dictionary table.

6. The method of claim 5, wherein said other query references one of said at least two columns but does not reference another of said at least two columns.

7. A method, the method comprising steps of:
   storing a dictionary table having one or more rows, wherein each row of said one or more rows maps a single token to an actual column value contained in a column of a base table, said dictionary table being stored and maintained as a data structure separate from said base table;
   storing in said column of said base table a particular single token in lieu of a particular actual column value mapped by a particular row of said one or more rows to said particular single token; and
   rewriting a query, that references said base table but not said dictionary table, into a transformed query that references the dictionary table.

8. The method of claim 7, the steps further including receiving a DDL statement that defines a compression group on said base table that includes said column.

9. A non-transitory computer-readable storage medium storing one or more sequences of instructions, said one or more sequences of instructions, which, when executed by one or more processors, causes the one or more processors to perform steps of:
   storing in an in-memory database a dictionary table that has one or more entries, wherein each entry of said one or more entries maps a single token to an actual column value contained in a corresponding column of a base table that is stored in said in-memory database, said dictionary table being stored and maintained as a data structure separate from said base table, said single token comprising an offset to a memory address to indicate a storage location of a row containing said entry mapping said single token to said actual column value;
   storing in said corresponding column of said base table a particular single token in lieu of a particular actual column value mapped by a particular entry of said one or more entries to said particular single token; and
   computing a query that conforms to a database language, wherein computing a query includes decoding the particular single token to generate the particular actual column value mapped by said particular entry to said respective single token.

10. The non-transitory computer-readable storage medium of claim 9, the steps further including rewriting another query that references said base table but not said dictionary table to create a transformed query that references said dictionary table.

11. The non-transitory computer-readable storage medium of claim 9, the steps further including receiving a DDL statement that defines a compression group on said base table.

12. A non-transitory computer-readable storage medium storing one or more sequences of instructions, said one or more sequences of instructions, which, when executed by one or more processors, causes the one or more processors to perform steps of:

storing a dictionary having one or more entries, wherein each entry of said one or more entries maps a single token to a combination of actual column values contained in at least two corresponding columns of a base table, said at least two corresponding columns comprising a compression group on said base table, said dictionary being stored and maintained as a data structure separate from said base table;

for a particular entry of said dictionary table, storing in said compression group of said base table the respective single token of said particular entry in lieu of the respective combination of actual column values that is mapped by said particular entry to said respective single token; and computing a query that conforms to a database language, wherein computing a query includes decoding the respective single token of said particular entry to generate the respective combination of actual column values that is mapped by said particular entry to said respective single token.

13. The non-transitory computer-readable storage medium of claim 12, wherein said dictionary is a dictionary table; and the steps further including rewriting another query, that references said base table but not said dictionary table, into a transformed query that references the dictionary table.

14. The non-transitory computer-readable storage medium of claim 13, wherein said other query references one of said at least two columns but does not reference another of said at least two columns.

15. A non-transitory computer-readable storage medium storing one or more sequences of instructions, said one or more sequences of instructions, which, when executed by one or more processors, causes the one or more processors to perform steps of:

storing a dictionary table having one or more rows, wherein each row of said one or more rows maps a single token to an actual column value contained in a column of a base table, said dictionary table being stored and maintained as a data structure separate from said base table;

storing in said column of said base table a particular single token in lieu of a particular actual column value mapped by a particular row of said one or more rows to said particular single token; and rewriting a query, that references said base table but not said dictionary table, into a transformed query that references the dictionary table.

16. The non-transitory computer-readable storage medium of claim 15, the steps further including receiving a DDL statement that defines a compression group on said base table that includes said column.

\* \* \* \* \*

UNITED STATES PATENT AND TRADEMARK OFFICE
CERTIFICATE OF CORRECTION

PATENT NO. : 10,756,759 B2
APPLICATION NO. : 13/224327
DATED : August 25, 2020
INVENTOR(S) : Lahiri et al.

It is certified that error appears in the above-identified patent and that said Letters Patent is hereby corrected as shown below:

On the Title Page

On page 2, Column 2, under Other Publications, Line 17, delete "2005, 2005," and insert -- 2005, --, therefor.

On page 2, Column 2, under Other Publications, Lines 23-24, delete "Applicaltions," and insert -- Applications, --, therefor.

On page 2, Column 2, under Other Publications, Line 44, delete "/wbxm/>" and insert -- /wbxml/> --, therefor.

On page 2, Column 2, under Other Publications, Line 47, delete "b28394/whatsnew.htm >" and insert -- b28394/whatsnew.htm> --, therefor.

On page 3, Column 1, under Other Publications, Line 13, delete "Perfomrance" and insert -- Performance --, therefor.

On page 3, Column 1, under Other Publications, Line 16, delete "Introduciton" and insert -- Introduction --, therefor.

On page 3, Column 1, under Other Publications, Line 19, delete "Optimzations" and insert -- Optimizations --, therefor.

In the Specification

In Column 2, Line 20, delete "Examplary" and insert -- Exemplary --, therefor.

In the Claims

In Column 10, Line 6, in Claim 4, delete "dictionary table," and insert -- dictionary, --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,756,759 B2

In Column 10, Line 63, in Claim 9, delete "of of" and insert -- of --, therefor.

In Column 11, Lines 15-16, in Claim 12, delete "causes the one or more processors to perform steps of:" and insert -- causes: --, therefor.

In Column 11, Line 25, in Claim 12, delete "dictionary table," and insert -- dictionary, --, therefor.

In Column 12, Line 4, in Claim 13, delete "the steps further including" and insert -- wherein the one or more sequences of instructions include instructions that, when executed by said one or more processors, cause --, therefor.

In Column 12, Lines 16-17, in Claim 15, delete "causes the one or more processors to perform steps of:" and insert -- causes: --, therefor.

In Column 12, Line 32, in Claim 16, delete "the steps further including" and insert -- wherein the one or more sequences of instructions include instructions that, when executed by said one or more processors, cause --, therefor.